Figure 1:
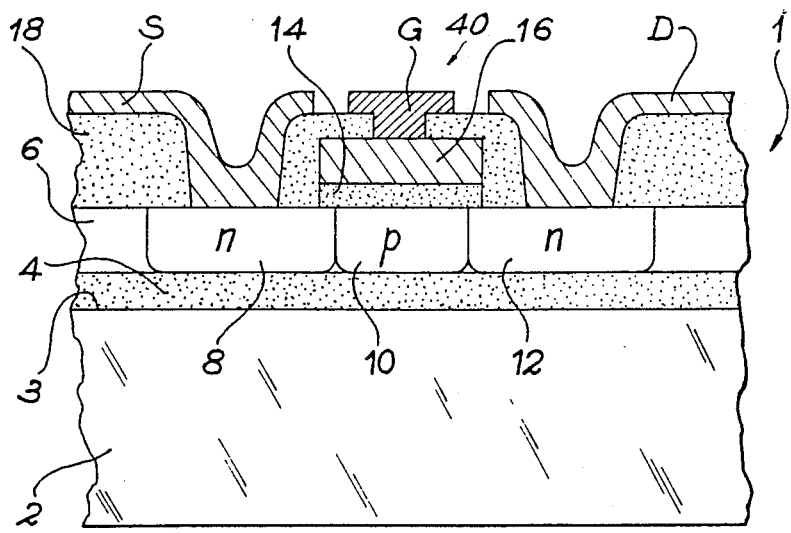

United States Patent [19]

Auberton-Herve et al.

[11] Patent Number: 4,954,989
[45] Date of Patent: Sep. 4, 1990

[54] MIS TYPE STATIC MEMORY CELL AND MEMORY AND STORAGE PROCESS

[75] Inventors: André-Jacques Auberton-Herve, St Egreve; Benoît Giffard, Grenoble, both of France

[73] Assignee: Commissariat a l'Energie Atomique, France

[21] Appl. No.: 335,732

[22] Filed: Apr. 10, 1989

[30] Foreign Application Priority Data

Apr. 12, 1988 [FR] France ............................ 88 04815

[51] Int. Cl.⁵ .......................................... G11C 11/40
[52] U.S. Cl. ................................. 365/177; 365/182
[58] Field of Search ............... 365/154, 156, 182, 190, 365/177, 175

[56] References Cited

U.S. PATENT DOCUMENTS 4,032,902 6/1977 Herndon ............................ 365/190
4,276,616 6/1981 Hennig ............................. 365/177

FOREIGN PATENT DOCUMENTS 2901538 7/1979 Fed. Rep. of Germany .

OTHER PUBLICATIONS

J. P. Colinge, "An SOI Voltage–Controlled Bipolar– MOS Device", IEEE Transactions on Electron Devices, vol. ED-34, No. 4, Apr. 1987, pp. 845-849.
IEEE Transactions on Nuclear Science, vol. NS-32, No. 6, Dec. 1985, pp. 4432-4437, IEEE, New York, US; G. E. Davis et al: "Transient Radiation Effects in SOI Memories".

Primary Examiner—Joseph A. Popek
Attorney, Agent, or Firm—Hayes, Soloway, Hennessey & Hage

[57] ABSTRACT

A static memory cell of the metal-insulator-semiconductor type, which can be used in the microelectronics field for producing random access memories for storing binary information. This MIS type memory cell is a random access static memory cell known under the abbreviation SRAM. A bistable flip-flop is formed by a MIS transistor and a parasitic bipolar transistor. The source and drain of the MIS transistor respectively formed by constituting the emitter and collector of the bipolar transistor. The region of the channel of the MIS transistor located between the source and drain serves as the base for the bipolar transistor. The base is completely isolated from the outside of the memory cell. The gate electrode of the MIS transistor is electrically isolated from the region of the channel. There is an addressing circuit for the flip-flop for storing binary information in the form of the absence or presence of current.

8 Claims, 2 Drawing Sheets

MIS TYPE STATIC MEMORY CELL AND MEMORY AND STORAGE PROCESS

DESCRIPTION

The present invention relates to a static memory cell of the MIS type (metal-insulator-semiconductor), which can be used in the microelectronics field for producing random access memories for storing binary information. This memory cell is a random access static memory cell known under the abbreviation SRAM.

The known static memory cells in MOS technology (metal-oxide-semiconductor) have a bistable flip-flop constituted by four MOS transistors and by two MOS transistors and two high value resistors, as described in a general article on RAM's, published in VLI System Design, by Muroga Saburo, pp. 248–252, Wiley Interscience.

MOS transistor static memories have the advantage of a high immunity to interference, particularly electrical interference. The surface of the memory circuit is the main element in the production costs; hence the interest in producing a memory cell which is as small as possible in order to bring about maximum cost reductions.

Moreover, it has recently been found that MOS transistors and in more general terms MIS transistors, produced in silicon on insulator technology and known as SOI, had a parasitic bipolar transistor. The latter leads to difficulties in optimizing the operation of the devices for the nominal supply voltage (e.g. 5 V).

This effect is particularly important in the case of SOI MOS transistors, because such transistors are conventionally produced with the zone of the channel floating electrically. However, the bipolar effect is due to the accumulation of minority carriers in the zone of the channel and namely holes for NMOS (N channel MOS), electrons for PMOS (P channel MOS), which have the effect of forward polarizing the source-channel junction. These minority carriers are generally produced in larger numbers in NMOS.

Moreover, as a result of the advances made in SOI materials, we now have high quality substrates. This makes it possible to produce MOS circuits with high performance characteristics, but this correlatively favours the "parasitic" bipolar effect, because the carriers have a very long life. As the transistor dimensions decrease, this parasitic effect increases in significance.

However, recently it has been envisaged to use this bipolar parasitic transistor in order to increase the conduction current of the MOS transistor. This use is described in IEEE Transactions on Electron Devices, Vol. ED-34, No. 4, Apr. 1987 by J. P. Colinge entitled "An SOI voltage-controlled bipolar-MOS device", pp. 845–849.

In this combined use of the MOS transistor and its associated parasitic bipolar transistor, there is an external connection linking the two transistors. Thus, the base of the bipolar transistor constituted by the channel region of the MOS transistor is electrically connected to the gate electrode of the MOS transistor. Moreover, the combined use of a MOS transistor and a parasitic bipolar transistor is described in the preceding document in silicon-on-insulator technology and in particular silicon on silicon oxide. However, this type of use leads to a significant current consumption by the external connection.

In the aforementioned general article on RAM's, bipolar transistor RAM's are also described. Static memories with bipolar transistors have the advantage, compared with memories with MOS transistors of having faster switching states enabling their use in fast circuits.

The invention also relates to a MIS type static memory cell not suffering from the disadvantages of the prior art. In particular, the memory cell has greatly reduced overall dimensions. It uses the parasitic bipolar transistor associated with each MOS transistor and in more general terms each MIS transistor for the random storage of a binary information. However, hitherto nobody has envisaged or described the use of a parasitic bipolar transistor associated with a MOS transistor for the storage of binary information.

More specifically, the present invention relates to a static memory cell comprising:

(A) a bistable flip-flop essentially formed by a MOS transistor and a parasitic bipolar transistor due to the structure of the MIS transistor, the source and drain of the MIS transistor respectively constituting the emitter and the collector of the bipolar transistor, the region of the channel of the MIS transistor between the source and drain serving as the base for the bipolar transistor, said base being completely isolated from the exterior of the memory cell, the gate electrode of the MIS transistor being electrically isolated from the channel region and (B) an addressing circuit for the flip-flop in order to apply with respect to the source raised to a reference potential:

(a) to the gate electrode a voltage $V_{G1}$ below the threshold voltage $V_{Bi}$ for triggering the bipolar transistor by the MIS transistor and to the drain a voltage $V_{D1}$ above the threshold voltage $V_{D0}$ for maintainig the bipolar transistor in the triggered state in order to maintain one of the states "0" or "1", (b) to the drain the voltage $V_{D1}$ and to the gate electrode a voltage $V_{G2}$ higher than $V_{Bi}$ or a light pulse adequate for triggering the MIS and bipolar transistors, in order to write the state "1", followed by the voltage $V_{G1}$, (c) to the gate electrode the voltage $V_{G1}$ and to the drain a voltage $V_{D2}$ lower than $V_{D0}$, in order to write the state "0" and then the voltage $V_{D1}$.

The expression "base totally electrically isolated from the exterior of the cell" means "base not accessible from the exterior of the cell".

As this memory cell only has one MIS transistor its overall dimensions are the same as those of said transistor.

The inventors have surprisingly proved that it was possible to store a binary information in the form of an absence of current (state "0") or the presence of current (state "1") in a MOS transistor, due to the inherent presence of an associated parasitic bipolar transistor. Moreover, this information is present and stable until a new storage sequence is applied and that the electric supply of said memory cell is maintained.

According to the invention, the source and drain are formed by a zone of a first conductivity type N or P and the channel by a zone of a second conductivity type P or N. In particular, the source and drain are of type N and the channel of type P. In addition, the material used for forming said zone must be a semiconductor material permitting the constitution of zones predominantly having a P-type doping (acceptor) and zones having a predominantly N-type doping (donor).

In order that the memory cell according to the invention functions correctly, it is necessary for the quality of the semiconductor material in which the N and P zones are defined ensures the maximum possible carrier diffusion length (i.e. greater than the length of the channel). It is also necessary to use transistors of limited length, i.e. a length below or approximately at 1000 nm.

Moreover, it is desirable for the memory cell to be isolated from the substrate. Furthermore, the N and P type zones are advantageously defined in a semiconductor layer supported by an electrically insulating material, which is itself located on a substrate. The semiconductor layer can be in the form of monocrystalline or polycrystalline silicon, a group III-V material such as GaAs, InSb, InP, etc. Moreover, the electrically insulating material is chosen from among $SiO_2$, SiO, $Si_3N_4$, ZnS, glass, etc.

Preference is given to the use of a monocrystalline silicon semiconductor material supported by a layer of silicon dioxide ($SiO_2$). These materials have the advantage of easy, well controlled realization and of satisfying the above requirements.

The means for addressing the memory cell and in particular the MIS transistor forming the same can be reduced to the electric power supplies supplying the appropriate voltages to the gate electrode, the source and the drain of the MIS transistor.

The invention also relates to a process for storing a binary information in a static memory cell of the type defined hereinbefore.

This process comprises applying with respect to the source, raised to a reference potential:
(a) to the gate electrode a voltage VG1 below the threshold voltage VBi for triggering the bipolar transistor by the MIS transistor and to the drain a voltage VD1 higher than the threshold voltage VD0 for maintaining the bipolar transistor triggered, in order to maintain one of the states "0" or "1",
(b) to the drain voltage VD1 and to the gate electrode a voltage VG2 higher than VBi or a light pulse sufficient to trigger the MIS and bipolar transistors, so as to permit the writing of state "1" and then the voltage VG1,
(c) to the gate electrode the voltage VG1 and to the drain a voltage VD2 below VD0 in order to write the state "0" and then the voltage VD1.

The invention also relates to a static memory comprising an array of memory cells as defined hereinbefore, connected to addressing rows and columns, the addressing of said memory consisting of applying, with respect to the sources raised to a reference potential:
(a) to each addressing row a voltage VE0 below the threshold voltage VBi for triggering bipolar transistors by MIS transistors and to each addressing column a voltage VM1 higher than the threshold voltage VD0 for maintaining the bipolar transistors triggered, so as to maintain the stored states "0" or "1",
(b) to the addressing column of the memory cell $\overline{ij}$ to be addressed a voltage VM2 higher than VM1 and to the addressing row of the cell to be addressed a voltage VE1 higher than voltage VBi for voltage VM2 and lower than VBi for voltage VM1, to the other addressing rows the voltage VE0 and to the other addressing columns the voltage VM1 for writing a "1" into the addressed memory cell,
(c) to all the other addressing rows the voltage VE1 and to all the other addressing columns the voltage VM1 and to the addressing row of the cell ij to be addressed the voltage VE0 and to its addressing column a voltage VM0 lower than VD0 and then the voltage VM1 and finally voltage VE0 to all the addressing rows, in order to write the state "0" into the addressed memory cell $\overline{ij}$.

The addressing circuit of each cell of the memory advantageously has a first diode connected on the one hand to the corresponding addressing column and on the other to the drain of the cell and a second diode connected on the one hand both to the corresponding addressing row and to the gate electrode of the cell and on the other hand to its drain.

All the given voltages represent absolute values. In the case of a N type transistor, the voltage are positive and the diodes are connected in the conductive sense of the addressing row and column to the transistor. In the case of a P type transistor, the voltages are negative and the diodes are connected in the reverse sense.

Figure 2:
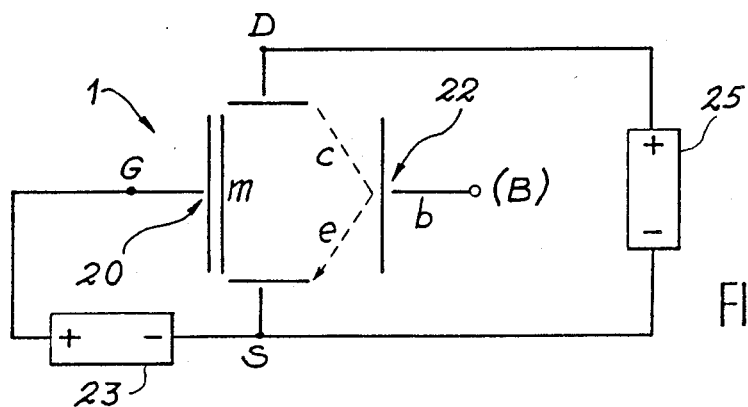

The invention is described in greater detail hereinafter relative to non-limitative embodiments and the attached drawings, wherein show:

FIG. 1 diagrammatically in longitudinal section, a MOS transistor which, according to the invention, constitutes a bistable flip-flop of a static memory cell, FIG. 2 a symbolic representation of the flip-flop of FIG. 1 making it possible to describe the operation of a memory cell according to the invention.

Figure 3:
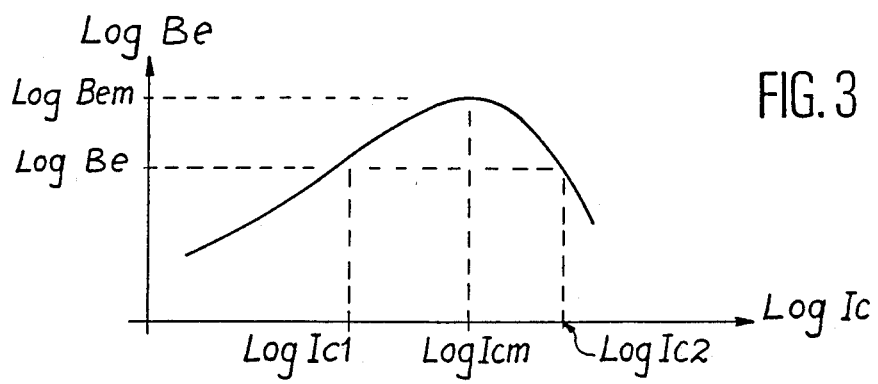

FIG. 3 a graph giving the variations of Be as a function of Ic, Be being the current gain of the bipolar transistor characteristic of the bipolar effect of the memory cell according to the invention and Ic the current flowing through the collector of the bipolar transistor.

Figure 4:
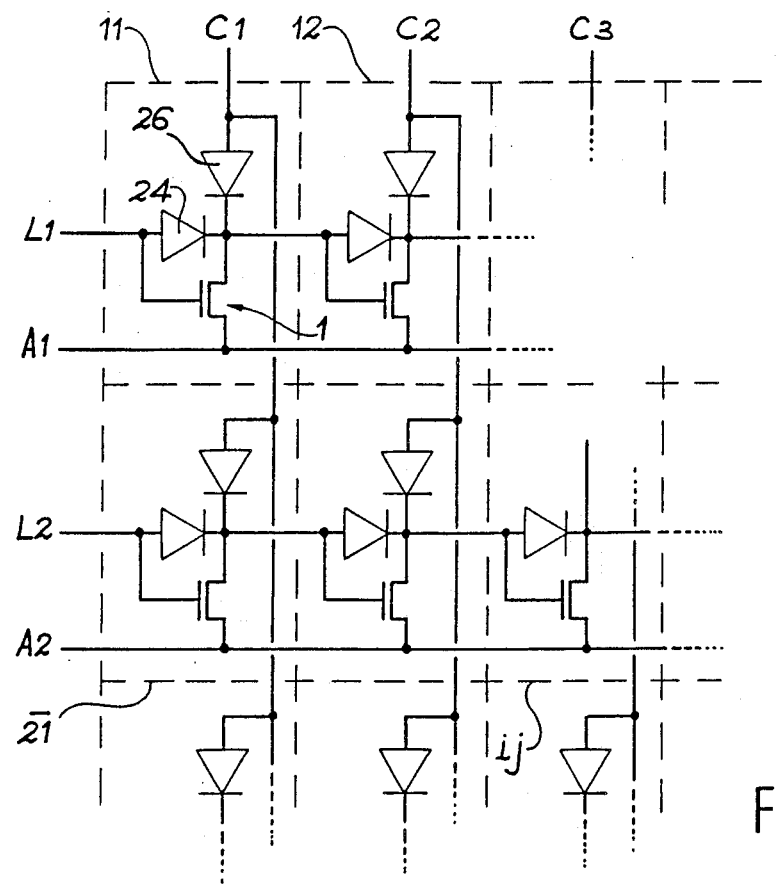

FIG. 4 a partial diagram of a static memory formed by an array of memory cells according to the invention.

Figure 5:
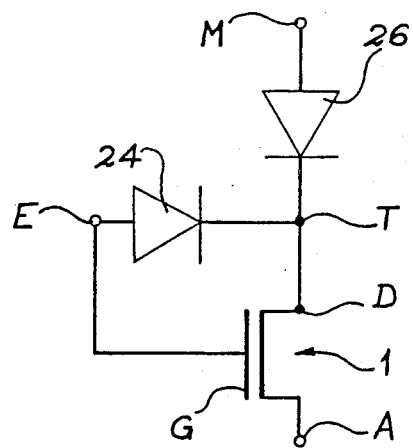

FIG. 5 an electric diagram of a complete memory cell according to the invention showing the addressing circuit of said cell in an array of cells.

The following description relates to a MOS static memory cell produced in silicon-on-insulator technology, bearing in mind the interest in this technology. However, it is obvious that, as described hereinbefore, the invention has a much more general application. Moreover, the source and drain of the MOS transistor are of the N type and its channel of the P type, although it would be possible to use P type drain and source and a N type channel. In this case it is merely necessary to change the sign of the voltages and currents used.

With reference to FIG. 1, the memory cell according to the invention and in particular its bistable flip-flop 1 are formed on a monocrystalline silicon semiconductor substrate 2 having on its upper surface 3 a silicon oxide layer 4 surmounted by a monocrystalline silicon semiconductor layer 6.

The insulating 4 and semiconductor 6 layers have respective thicknesses of 300 and 200 nm. They are more particularly obtained by the Simox method described in the article by P. L. F. Hemment et al, in Nuclear Instruments and Methods, 209/210, 1983, pp. 157-164 and entitled "Formation of Buried Insulating Layers in Silicon by the Implantation of High Doses of Oxygen".

This technology consists of implanting with a high dose oxygen ions in the substrate and then annealing the implanted substrate at high temperature with a view to obtaining a buried insulating layer. This method for obtaining a buried insulating layer makes it possible to obtain high Bem values (maximum Be value, Be characterizing the gain of the bipolar effect, cf. FIG. 3) necessary for the operation of the cell according to the invention.

Three semiconductor zones 8, 10, 12 and respectively doped N, P and N, thus defining two N-P junctions 8-10 and 10-12 are formed by ion implantation in known manner in semiconductor layer 6. Zones 8 and 12 contain approximately $5.10^{15}$ arsenic ions/cm$^2$ and zone 10 approximately $10^{13}$ boron ions/cm$^2$.

The memory cell flip-flop also has 25 nm thick, SiO$_2$ insulating material 14 completely covering the P type region 10 and electrically insulating or isolating the latter from e.g. a polycrystalline silicon gate electrode 16 doped with 5 to 10% phosphorus and having a thickness of 400 nm.

Electrode 16 and the N type external semiconductor zones 8 and 12 are connected to the exterior of the cell with the aid of three connections G, S and D made in particular from aluminium. An appropriately etched insulating layer 18 ensures the electrical insulation of these three connections S, G and D. Layer 18 is in particular a 400 nm thick SiO$_2$ layer. Connections S, G and D are in particular produced in an appropriately etched, 1000 nm thick aluminium layer.

According to the invention, the central type P zone 10 is not connected to the exterior of the memory cell according to the invention and is even isolated therefrom by means of the SiO$_2$ layer 4.

The memory cell according to the invention cumulates the physical effects of a MOS transistor on the surface, beneath the electrode 16 and a junction bipolar transistor, in volume, said two effects being necessary for the operation of the memory cell.

According to the invention, the N type regions 8 and 12 respectively constitute the source and drain of the MOS transistor and the P type region 10 its channel. Moreover, zones 8, 10 and 12 respectively constitute the emitter, the base and the collector of the bipolar transistor.

FIG. 2 is the equivalent circuit diagram of the bistable flip-flop 1 of the memory cell of FIG. 1. The transistors are represented symbolically, the MOS transistor carrying the reference 20 and the bipolar transistor the reference 22.

Connection B is a fictional connection not accessible from the outside of the memory cell. It represents the P type semiconductor zone 10 or the base of the bipolar transistor 22.

The electrical potential of the memory cell at point S is taken as the reference, so that the voltages between points G,D,B on the one hand and S on the other are respectively designated VG, VD and VB. These voltages are applied with the aid of two electric power sources 23 and 25, source 23 being connected between the source and gate electrode and source 25 between the source and drain. The currents flowing in branches m,c,e and b are respectively designated Im, Ic, Ie and Ib, Im representing the current flowing from the drain to the source, Ic the current entering the collector, Ie the current leaving the emitter and Ib the current entering base.

A description will now be given of the isolated operation of the MOS transistor, then that of the bipolar transistor and finally the combined operation of the MOS and bipolar transistors for the storage of information "1" or "0".

I Isolated operation of the MOS transistor

As VD is positive and fixed at VD1, there is a voltage VG=VGT, so that for VG<VGT the MOS transistor 20 is blocked with Im zero or negligible and for VG>VGT the MOS transistor is conductive with Im>0. VGT corresponds to the threshold voltage for triggering the MOS transistor.

When Im is not zero, the passage of current Im leads to the formation, mainly in the N-P junction (drain side) 10-12, of pairs of electron+hole electric carriers as a result of a multiplication phenomenon. The number of carriers created is an increasing function of Im and VD. The holes created charge the P type central zone 10, which in FIG. 2 is the equivalent of attributing to Ib a corresponding non-zero value Ib1. In the combined operation of the MOS and bipolar transistors said current Ib1 serves to start the operation of the bipolar transistor.

II Isolated operation of the bipolar transistor

As VD is positive and fixed, there is a voltage VDM such that for VD>VDM, said bipolar transistor 22 is highly conductive as a result of an avalanche phenomenon in the junction N-P (drain side) 10-12. This "base breakdown in air" phenomenon, called this because the connection B is not connected to the outside of the memory cell, constitutes the operating limit for the latter. For VD<VDM, there is a low multiplication phenomenon in junction N-P 10-12 leading to the creation of electron+hole pairs.

This phenomenon is identical to the multiplication phenomenon described for the operation of MOS transistor 20. It is also an increasing function of both VD and Ic. The hole current Ib is equal to Ib2 in this case. The hole current is characterized by the value Mu, which corresponds to the ratio Ib2/Ic and, for the clarity of the description, is assumed to be dependent solely on VD, Mu being an increasing function of VD.

Moreover, for a given value of Ic, there is a value characterizing the bipolar effect of the memory cell, which is called Be. Be is defined as the ratio Ic/Ib with Ib=Ib1+Ib2 in the case of the combined operation of the MOS and bipolar transistors.

The variations of Be as a function of Ic are given in FIG. 3. The curve of FIG. 3 in fact represents Log Be as a function of Log (Ic). The function Be is a function having a maximum when Ic increases. The coordinates of the maximum are Bem and Icm. In FIG. 3 are also plotted two values of Ic on either side of the maximum designated Ic1 and Ic2.

For Ib=Ib2, the preceding relations Ic=Be.Ib and Ic.Mu=Ib2 lead to two solutions, namely either the product MuxBe is 1, or Ic=Ib=0. The first case corresponds to self-maintaining of the current of the bipolar transistor 22, i.e. the transistor is kept triggered. For a given value of Mu, three cases occur:

(a) Bem is too low and such that MuxBem<1, self-maintaining not being possible, the only possible operating point of the bipolar transistor being Ic=Ib=0;

(b) Bem is exactly 1/Mu and there is only one possible value of Ic ensuring self-maintaining, which is Icm;

(c) Bem exceeds 1/Mu and there are two possible values of Ic, namely Ic1 and Ic2, which satisfy the relation BexMu=1—the lower of these two values Ic1 leading to an unstable equilibrium and any disturbance thereof is reinforced and leads to a disequilibrium, either towards point Ic=Ib=0, or towards the second value Ic2, which is a stable equilibrium.

III Combined operation of the MOS and bipolar transistors.

This operation involves an inoperative state, a cycle of writing a "1", a storage (or maintaining state) for a "1" or a "0" and a state of writing a "0".

In the remainder of the text, VD0 will be used for referring to the voltage between the source and the drain, which corresponds to Mu=1/Bem. Moreover, VD0 is lower than VDM. VD0 corresponds to the threshold for maintaining triggered the bipolar effect. Moreover, VBi is the voltage VG triggering the bipolar transistor by the current Ib1 produced by the MOS transistor for a given voltage VD. This threshold voltage VBi is a decreasing function of the voltage VD applied to the drain.

(1) Inoperative State

To electrode 16 is applied a potential such that VG=VG1, VG1 being below VBi, and to drain 12 a potential such that VD=VD1, VD1 being lower than VDM and higher than VD0, so that Mu is higher than 1/Bem (cf. FIG. 3). The current Im is then zero and the bipolar transistor is blocked at point Ic=Ib=0. This inoperative state is also the state of storing a "0".

(2) Cycle of writing a "1"

The voltage VD1 is maintained between the source and the drain and to the gate is temporarily applied a voltage such that VG passes to a value VG2 higher than VG1, which corresponds to the passage of a current Im and a multiplication current Ib1. Current Ib1 starts or switches on the bipolar transistor and, if Ib1 is sufficiently high, or if VG2>VBi, Ic reaches the value Ic1 (cf. FIG. 3) for which the product BexMu is 1. This point is unstable and the bipolar transistor then stabilizes at Ic=Ic2, the stable self-maintaining point. The state "1" is then stored. The passage from the unstable point Ic1 to the stable point Ic2 corresponds to the triggering of the bipolar transistor. There is a drop again to VG below VBi.

(3) State of storing a "1"

The bipolar transistor has stabilized at Ic=Ic2 and the MOS transistor produces a current Ib1 which is not high enough to trigger the bipolar transistor and it can e.g. be blocked. The presence of this non-zero current Ic2 is the image of the storage of the binary information "1".

(4) Cycle of writing a "0"

Starting from the state of storing a "1" or the inoperative state, VD is brought to a voltage VD2 below VD0, in such a way that the product BemxMu is lower than 1. Under these conditions, the only operating point of the bipolar transistor, in the absence of a current Ib1 due to the MOS transistor, is Ic=Ib=0, state "0" then being stored. VD is then brought to its inoperative state value VD1.

The use of a memory cell like that described hereinbefore is made more attractive when it is possible to regroup several of these cells, as shown in FIG. 4, in the form of a matrix or array, which are addressed in accordance with rows Li and columns Cj, i and j being positive integers (1,2,3 etc.). The addressing of a given row Li and a given column Cj corresponds to a single memory cell ij. Conductors Ai raise the sources of the memory cells $\overline{ij}$ to a reference potential.

To carry out the addressing of a single memory point, it is necessary that the latter only reacts to the action of one row and one column. To this end, to the previously described flip-flop 1 is added an addressing circuit. This addressing circuit, plus the aforementioned MOS transistor (FIG. 1) or flip-flop form the actual memory cell of a memory. A complete memory cell of a memory is shown in FIG. 5.

The addressing circuit shown in FIG. 5 is constituted by two diodes 24 and 26. Such a circuit is perfectly adapted to the storage means 1 formed by a single MOS transistor according to the invention. Diode 26 is connected in the conductive sense on the one hand to the corresponding addressing column Cj and on the other to the drain of the MOS transistor of cell $\overline{ij}$. Diode 24 is connected in the conductive sense on the one hand to both the corresponding addressing row Li and the gate electrode of cell ij and on the other hand to its drain.

In FIG. 5 the potentials are referenced with respect to the connection A. The voltages present between points E and M on the one hand and A on the other are respectively designated hereinafter by VE, point E corresponding to the addressing row Li of the bits and by VM, in which M corresponds to the addressing column Cj of the memory words. The potential of point A is the reference potential of the memory cell and is continuously applied to the sources 8 of the MOS transistors.

For simplification purposes, it is assumed that diodes 24 and 26 are in the ideal form, i.e. having no forward voltage or reverse current.

With VBi being the triggering threshold voltage for the bipolar transistor 22 defined in paragraph III, two voltage values VE classified as follows VE0<VBi<VE1 are used for the voltage VM2 and VE0<VE1<VBi for the voltage VM1. Moreover, with VD0 being the limit voltage of VM (corresponding to the product BemxMu=1), three voltage values VM classified as follows VM0<VD0<VM1<VM2<VDM are used.

Moreover, there are voltage pairs VE and VM, such that the writing of state "1" does not take place in the MOS transistor, which is the case for pair VE1 and VM1, whereas for other pairs the writing of state "1" takes place, which applies with regards to VE1 and VM2. Finally, we obtain VE1=VM1. Thus, voltages VE1 and VM1 are chosen so that the current Ib1 produced by the MOS transistor is sufficiently low to ensure that current Ic leads to a value of Be such that BexMu<1 does not permit a triggering of the bipolar transistor. Moreover, voltages VE1 and VM2 are chosen so as to trigger the bipolar transistor (Ib1 being Ic≧Ic1).

A description will now be given in exemplified manner of the addressing of the memory circuit $\overline{11}$ in an array of memory cells according to the invention.

(A) Inoperative State

To all the addressing rows L1, L2, etc. and therefore the electrodes of the memory cells is applied a voltage such that VE=VE0, whilst to all the drains or addressing columns C1, C2, C3, etc., is applied a voltage such that VM=VM1. The MOS transistors 20 cannot trigger the bipolar transistors and the latter have a current which is either zero, or defined by the point Ic2 in FIG. 3, as a function of the stored state ("0" or "1").

(B) Cycle of writing a "1"

To the electrode or addressing row $L^1$ of memory cell $\overline{11}$ is applied a voltage such that VE=VE1 and to the drain or to the addressing column C1 of said cell a voltage such that VM=VM2. The other rows L2, etc., and columns C2, C3, etc., remain in the inoperative state A. Under these conditions, the cell $\overline{11}$ in question passes to state "1", whereas all the others continue to store their previous state (no matter what the voltage pair VE0, VM1 or VE0 VM2 or VE1 VM1 applied thereto). The voltages are then brought to the inoperative state A.

(C) Cycle of writing a "0"

To all the addressing rows L2, etc., other than row L1 is applied a voltage such that VE=VE1 and to all the columns C2, C3, etc., other than column C1, a voltage VM1 and to row L1 or the addressed electrode a voltage such that VE=VE0 and to the addressed column C1 or addressed drain a voltage such that VM=VM0. The addressed cell cannot maintain its state "1" and is therefore brought to state "0".

The other memory cells store their previous state. In particular the cells on the same column C1 as the addressed cell $\overline{11}$ are supplied to the node T of FIG. 5 across diode 24 by the voltage VE1 (VE1>VM0). Diode 26 prevents the voltage VE1 being transmitted in this case to point M. In the same way, diode 24 ensures that voltage VM is not transmitted to point E in all cases where VM>VE.

After this operation of writing a "0", the voltage VM of the memory cell $\overline{11}$ passes to VM1 and then all the rows are passed to VE0. All the memory cells are then in the inoperative state A.

(D) Reading cycle

There is not in actual fact a reading cycle. Thus, a writing of a given state "1" or "0" takes place with the simultaneous detection of a possible change of state through the optional passage of an additional current into the column C1 connected to M making it possible to determine the previous state, the read value then being rewritten. The detection of the possible change of state can take place in conventional manner.

The static memory cell according to the invention uses in an active manner the MOS transistor and the bipolar transistor inherent in the MOS structure. It permits a storage of state "1" or "0" in the same way as the MOS static cells of the prior art only using a single MOS transistor instead of four. Therefore the overall dimensions of said memory cell is the same as that of the single MOS transistor in question.

With a view to obtaining a very precise memory effect with the memory cell according to the invention, preference is given (FIG. 1) to the use of a monocrystalline silicon substrate 2 with a buried silicon oxide layer 4 in order to increase parameter Be. This buried layer, annealed at a temperature of approximately 1300° C., makes it possible to improve the electrical properties of substrate 2 and therefore those of layer 6, as well as those of the oxide layer, which leads to an increase in the gain Be of the bipolar transistor. Moreover, the choice of the NPN or possibly the PNP structure and abrupt N-P junctions makes it possible to increase the parameter Mu. Moreover, the use of very short MOS transistor (approximately one micrometre) further increases parameter Be.

In exemplified manner are given hereinafter the different values of voltages applied to a memory cell according to the invention produced by the Simox process and having a N doping of $5.10^{15}$ arsenic ions/cm$^2$, a P doping of $1.10^3$ boron ions/cm$^2$, a 1000 nm long channel, a 300 nm thick buried $SiO_2$ layer, a 200 nm thick monocrystalline silicon layer, a 25 nm thick gate oxide, a 400 nm thick polycrystalline silicon gate and 1000 nm thick aluminium source, drain and gate connections.

(a) Memory cell only

VD0=3.5 V VD1=3 V, VD2=4 V
VBi=0.5 V VG1=0 V Source reference voltage =0 V
VG2=4 V (b) Memory cell in an array VD0=3.5 V VE0=0 V VE1=4 V
VBi=0.5 V VM0=3 V VM1=4 V VM2=5 V The triggering of the bipolar transistor and MIS transistor of the above memory cell can also be obtained by illuminating the transistor (FIG. 1) with the aid of white light supplied by a projector-type lamp having a power of 1 $\mu W/\mu/m^2$.

We claim:

1. Static memory cell comprising:
   (A) a bistable flip-flop (1) essentially formed by a MOS transistor (20) and a parasitic bipolar transistor (22) formed by the structure of a MIS transistor, a source (8) and drain (12) of the MIS transistor respectively constituting the emitter and the collector of the bipolar transistor, the region of the p-channel (10) of the MIS transistor between the source and drain serving as the base for the bipolar transistor, said base being electrically isolated from the direct connection to exterior of the memory cell, a gate electrode (16) of the MIS transistor being electrically isolated from the channel (10) region and
   (B) an addressing circuit (23,25) for the flip-flop in order to apply with respect to the source (8) raised to a reference potential:
      (a) to the gate electrode (16) a voltage VG1 below a first threshold voltage VBi for triggering the bipolar transistor by the MIS transistor (20) and to the drain a voltage VD1 above a second threshold voltage VD0 for maintaining the bipolar transistor (22) in the triggered state in order to maintain a state with value of "0" or "1",
      (b) to the drain (12) the voltage VD1 and to the gate electrode (16) a voltage VG2 higher than VBi or a pulse of illuminating white light, having a power of magnitude 1 $\mu W/\mu/m^{22}$ adequate for triggering the MIS and bipolar transistors, in order to write the state "1", followed by the voltage VG1,
      (c) to the gate electrode (16) the voltage VG1 and to the drain (12) a voltage VD2 lower than VD0, in order to write the state "0" and then the voltage VD1.

2. Memory cell according to claim 1, characterized in that the source and drain (8,12) are formed from a zone of a first conductivity type, the channel (10) from a zone of a second conductivity type, said zones being defined in a semiconductor layer (6) supported by an electrical insulating material (4).

3. Memory cell according to claim 2, characterized in that the semiconductor layer (6) is of monocrystalline silicon.

4. Memory cell according to claim 2, characterized in that the insulating material (4) is of silicon dioxide.

5. Memory cell according to claim 1, characterized in that the addressing circuit (23,25) comprises a first electric power source (23) connected between source (8) and gate electrode (16) and a second electric power source (25) connected between source (8) and drain (12).

6. A method for storing information in a static memory cell comprising a bistable flip-flop essentially formed by a MIS transistor (20), whose gate electrode (16) is electrically isolated from the region of channel (10) of the MIS transistor and a parasitic bipolar transistor (22) due to the structure of the MIS transistor, a source (8) and drain (12) of the MIS transistor respectively constituting the emitter and the collector of the bipolar transistor, the region of channel (10) of the MIS transistor located between the source and drain serving as the base for the bipolar transistor, said base being totally electrically isolated from direct connection to the exterior of the memory cell, said method comprises applying with respect to the source, raised to a reference potential:

(a) to the gate electrode (16) a voltage VG1 below a threshold voltage VBi for triggering the bipolar transistor by the MIS transistor (20) and to the drain a voltage VD1 higher than the threshold voltage VD0 for maintaining the bipolar transistor (22) triggered, in order to maintain a state with value of "0" or "1", (b) to the drain (12) voltage VD1 and to the gate electrode (16) a voltage VG2 higher than VBi or a pulse of illuminating white light, having a power of magnitude 1 $\mu W/\mu/m^{22}$, sufficient to trigger the MIS and bipolar transistors, so as to permit the writing of state "1" and then the voltage VG1, (c) to the gate electrode (16) the voltage VG1 and to the drain (12) a voltage VD2 below VD0 in order to write the state "0" and then the voltage VD1.

7. Static memory comprising an array of memory cells distributed along addressing rows (Li) and columns (Cj) of said memory cells, characterized in that each memory cell comprises:

(A) a bistable flip-flop (1) essentially formed by a MIS transistor and a parasitic bipolar transistor due to the structure of the MIS transistor, a source (8) and drain (12) of the MIS transistor (20) respectively constituting the emitter and the collector of the bipolar transistor (22), the region of the channel (10) of the MIS transistor located between the source and drain serving as the base of the bipolar transistor, said base being completely isolated from the outside of the memory cell, the gate electrode (16) of the MIS transistor being electrically isolated from the region of channel (10) and (B) an addressing circuit (24,26) for the flip-flop, the addressing of a memory cell (ij) consisting of applying, with respect to the sources of the MIS transistors raised to a reference potential:

(a) to each addressing row a voltage VE0 below the threshold voltage VBi for triggering bipolar transistors by MIS transistors and to each addressing column a voltage VM1 higher than a threshold voltage VD0 for maintaining the bipolar transistors triggered, so as to maintain a stored state with value of "0" or "1", (b) to the addressing column of the memory cell (ij) to be addressed a voltage VM2 higher than VM1 and to the addressing row of the cell to be addressed a voltage VE1 higher that voltage VBi for voltage VM2 and lower than VBi for voltage VM1, to the other addressing rows the voltage VE0 and to the other addressing columns the voltage VM1 for writing a "1" into the addressed memory cell, (c) to all the other addressing rows the voltage VE1 and to all the other addressing columns the voltage VM1 and to the addressing rows of the cell (ij) to be addressed the voltage VE0 and to its addressing column a voltage VM0 lower than VD0 and then the voltage VM1 and finally voltage VE0 to all the addressing rows, in order to write the state "0" into the addressed memory cell (ij).

8. Static memory according to claim 7, characterized in that the addressing circuit of each flip-flop comprises a first diode (26) connected to the drain (12) of the corresponding MIS transistor for the addressing of words and a second diode (24) for addressing bits connected to the gate (16) of said MIS transistor.

* * * * *